US005976303A

United States Patent [19]
Aoki

[11] Patent Number: 5,976,303
[45] Date of Patent: Nov. 2, 1999

[54] METHOD OF ATTACHING NOZZLE PLATE TO INK JET ACTUATOR

[75] Inventor: Nobuo Aoki, Nagoya, Japan

[73] Assignee: Brother Kogyo Kabushiki Kaisha, Nagoya, Japan

[21] Appl. No.: 08/806,930

[22] Filed: Feb. 26, 1997

[30] Foreign Application Priority Data

Feb. 28, 1996 [JP] Japan .................................... 8-69182
Mar. 13, 1996 [JP] Japan .................................... 8-85776

[51] Int. Cl.[6] ................................................ H05K 3/00
[52] U.S. Cl. .................................. 156/308.2; 156/583.1
[58] Field of Search ...................... 29/890.1; 156/583.1, 156/307.7, 308.2

[56] References Cited

U.S. PATENT DOCUMENTS

| | | | |
|---|---|---|---|
| 1,015,404 | 1/1912 | Schewczik | 156/583.1 X |
| 1,777,642 | 10/1930 | Harrington | 156/106 |
| 2,371,847 | 3/1945 | Saunders et al. | 156/291 |
| 2,684,775 | 7/1954 | Von Hofe | 156/215 |
| 2,782,818 | 2/1957 | Christeson | 156/583.1 X |
| 3,172,798 | 3/1965 | Rosenbaum | 156/583.1 X |
| 4,516,140 | 5/1985 | Durkee et al. | 347/71 |
| 4,687,526 | 8/1987 | Wilfert | 156/64 |
| 5,098,503 | 3/1992 | Drake | 156/299 |
| 5,218,381 | 6/1993 | Narang et al. | 347/45 |

*Primary Examiner*—Francis J. Lorin
*Attorney, Agent, or Firm*—Oliff & Berridge, PLC

[57] ABSTRACT

The distance A between opposite end nozzles 4*e* and 4*e* on the nozzle plate 4 is set smaller than the distance B between opposite end link channels 3*e* and 3*e* in the actuator. The difference between the distances A and B is determined dependent on the difference between the thermal expansion coefficients of the actuator and of the nozzle plate. After being heated, the nozzles will be properly located in correspondence with the ink channels. During the heating step, the nozzle plate is placed on the actuator via an adhesive. Then, the heater block is placed on the nozzle plate to heat the adhesive via the nozzle plate and to press the nozzle plate from upwardly. Accordingly, the temperature of the adhesive rapidly increases, whereby gas is completely discharged from the adhesive before the adhesive is completely hardened.

18 Claims, 5 Drawing Sheets

METHOD OF ATTACHING NOZZLE PLATE TO INK JET ACTUATOR

BACKGROUND OF THE INVENTION

1. Field of the Invention

The present invention relates to a method of attaching a nozzle plate to an actuator for an ink jet print head. More particularly, the present invention relates to a method of attaching the nozzle plate to the actuator through thermally hardening adhesive provided between the nozzle plate and the actuator.

2. Description of Related Art

In order to produce an ink jet print head, an actuator and a nozzle plate are first produced. The actuator is formed with a plurality of ink channels. The ink channels are arranged with a uniform interval. The nozzle plate is formed with a plurality of nozzles. The number of the nozzles on the nozzle plate is the same as that of the ink channels. The nozzles are formed to be arranged with an interval equal to that of the ink channels. The intervals are measured under a room temperature when the channels and the nozzles are produced.

The nozzle plate is then attached onto the actuator in a manner described below with reference to FIG. 1.

First, the nozzle plate 4 is placed on the actuator 2 with epoxy resin provided therebetween so that each nozzle is precisely located on a corresponding ink channel.

Then, the nozzle plate 4 and the actuator 2 are mounted in a jig 50 shown in FIG. 1. In the jig 50, the nozzle plate 4 and the actuator 2 are sandwiched between a holding plate 41 and a base block 42. A silicone rubber sheet 30 is provided between the actuator 2 and the base block 42. The holding plate 41 and the base block 42 press the nozzle plate 4 against the actuator 2 when a screw 43 is tightened.

The jig 50 is then mounted in a heating device such as an oven (not shown). The jig 50 is heated at about 150° C. for 30 minutes. Accordingly, while being applied with pressure, the nozzle plate 4 and the actuator 2 are heated at about 150° C. for 30 minutes. As a result, the epoxy resin is thermally hardened, thereby firmly attaching the nozzle plate 4 to the actuator 2.

It is noted that thus applying heat leads thermal expansion of the nozzle plate 4 and the actuator 2. However, the thermal expansion coefficient of the nozzle plate 4 is different from that of the actuator 2. This is because the nozzle plate 4 is generally made of polyimide resin, while the actuator 2 is made of piezoelectric ceramic. Therefore, after the heating process, the positions of the nozzles on the nozzle plate 4 are shifted from the positions of the ink channels in the actuator 2. The nozzles fail to be positioned precisely corresponding to the ink channels. Accordingly, when the thus produced assembly of the nozzle plate 4 and the actuator 2 is employed in a print head, the assembly attains poor ink ejection, and therefore degrades printing quality.

Additionally, during the heating process, the jig 50 is heated in the oven together with the nozzle plate 4 and the actuator 2. Because the nozzle plate 4, the actuator 2, and the jig 50 have large thermal capacities, the temperatures thereof increase gradually. As the temperatures of the actuator 2 and the nozzle plate 4 increase, the epoxy resin starts being hardened and discharging gas. However, when the temperature increases at a low rate, the gas is discharged slowly from the epoxy resin. As a result, when the epoxy resin is hardened completely, the gas is still remained in the epoxy resin. The gas thus trapped in the hardened epoxy resin forms air bubbles. If the air bubble is located on a surface of the hardened epoxy resin contacting the nozzle plate 4 or the actuator 2, a space is formed between the epoxy resin and the nozzle plate 4 or the actuator 2. Thus produced space weakens attachment between the nozzle plate 4 and the actuator 2. Also, when the nozzle plate 4 is wiped for maintenance during printing, the nozzle plate 4 will possibly drop from the actuator 2.

SUMMARY OF THE INVENTION

It is therefore an object of the present invention to solve the above-described problems and to provide a method of attaching a nozzle plate to an actuator so that nozzles will be accurately positioned in correspondence with the ink channels and so that the nozzle plate will be firmly attached to the actuator with no air bubbles being formed in the epoxy resin.

In order to attain the above and other objects, the present invention provides a method of attaching a nozzle plate to an actuator via an adhesive, the method comprising the steps of: preparing a nozzle plate formed with a plurality of nozzles and an actuator formed with a plurality of channels, positions of the nozzles and positions of the channels being determined dependently on a difference between thermal expansion coefficients of the nozzle plate and of the actuator; placing the nozzle plate on the actuator with an adhesive being provided therebetween, and heating the adhesive so as to thermally harden the adhesive thereby fixedly securing the nozzle plate to the actuator, the nozzle plate expanding according to its thermal expansion coefficient and the actuator expanding according to its thermal expansion coefficient so that the positions of the nozzles on the expanded nozzle plate correspond to the positions of the channels in the expanded actuator.

According to another aspect, the present invention provides a method of attaching a nozzle plate to an actuator, the method comprising the steps of placing a nozzle plate, formed with a plurality of nozzles, on an actuator formed with a plurality of ink channels, an adhesive being provided between the nozzle plate and the actuator; and attaching a heating member to the nozzle plate, the heating member applying heat to the nozzle plate while pressing the nozzle plate against the actuator, thereby the adhesive being thermally hardened to firmly connect the nozzle plate to the actuator.

BRIEF DESCRIPTION OF THE DRAWINGS

The particular features and advantages of the invention as well as other objects will become more apparent from the following description taken in connection with the accompanying drawings, in which:

FIG. 2(*b*) is a block diagram of a control unit for the ink jet print head 1;

FIG. 3(*b*) illustrates an operation of an actuator 2 of the ink jet print head 1 when electric voltages are applied to electrodes 6;

FIG. 5(*b*) shows a channel pitch of the ink channels 3 of the actuator 2;

FIG. 7(*b*) is a cross-sectional view of the heater block 32 taken along a line VIIB—VIIB in FIG. 7(*a*).

DETAILED DESCRIPTION OF THE PREFERRED EMBODIMENT

Figure 1:
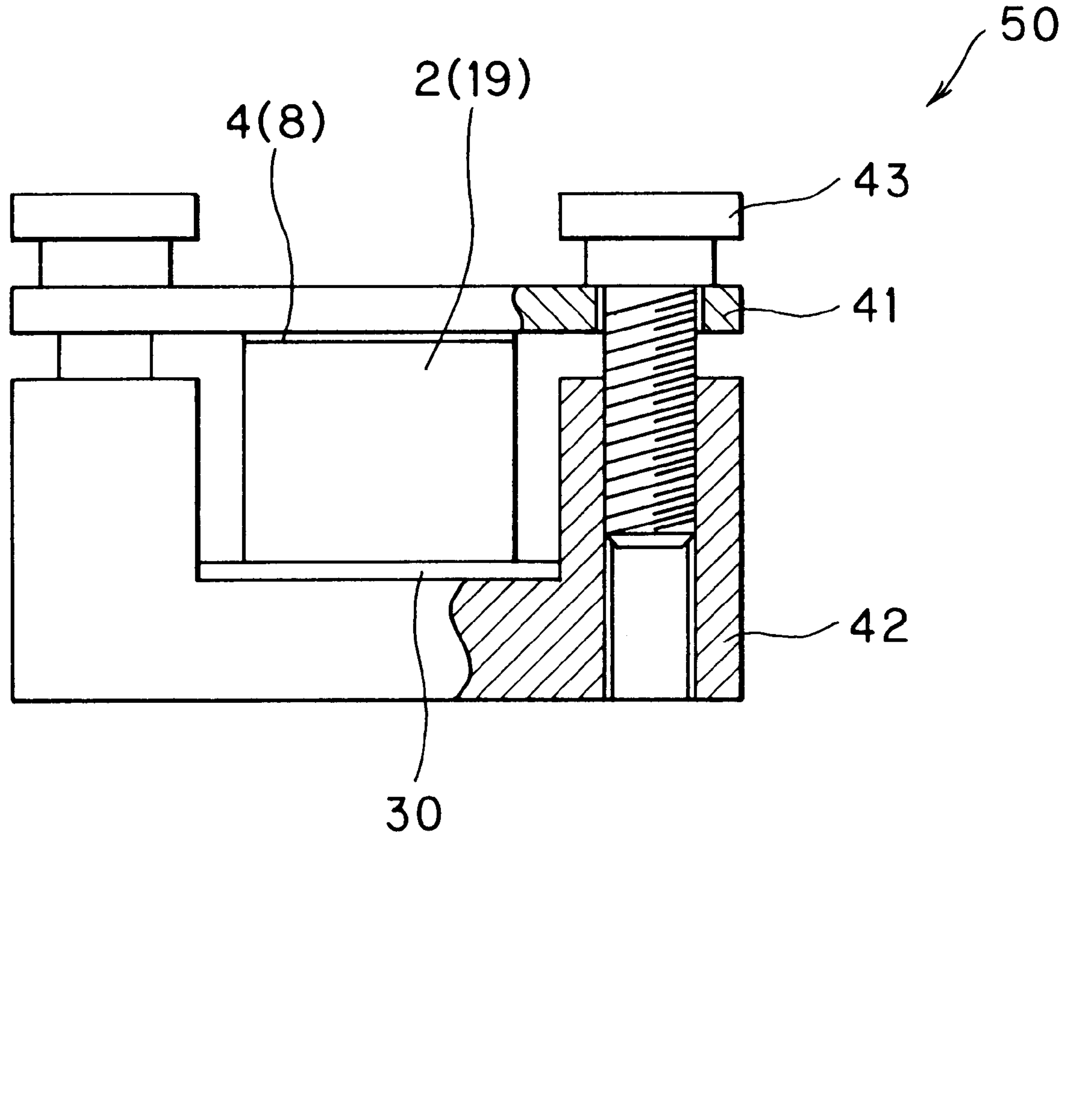
FIG. 1 is a side view showing how the nozzle plate and the actuator are sandwiched between a holding member and a base block and heated in a conventional method.

A method of attaching a nozzle plate to an actuator according to a preferred embodiment of the present invention will be described while referring to the accompanying drawings wherein like parts and components are designated by the same reference numerals to avoid duplicating description.

First, an ink jet print head, to which the present invention is applied, will be described. The ink jet print head is used in an ink jet printing device. This type of ink jet print head includes an actuator formed with a plurality of pairs of side walls made of piezoelectric ceramic, an ink chamber being formed between each pair of side walls. Each pair of side walls displace by a shear mode effect to thereby pressurize ink in the ink chamber provided therebetween, whereby the ink is ejected from the ink chamber to print ink dots onto recording sheets.

Figure 2A:
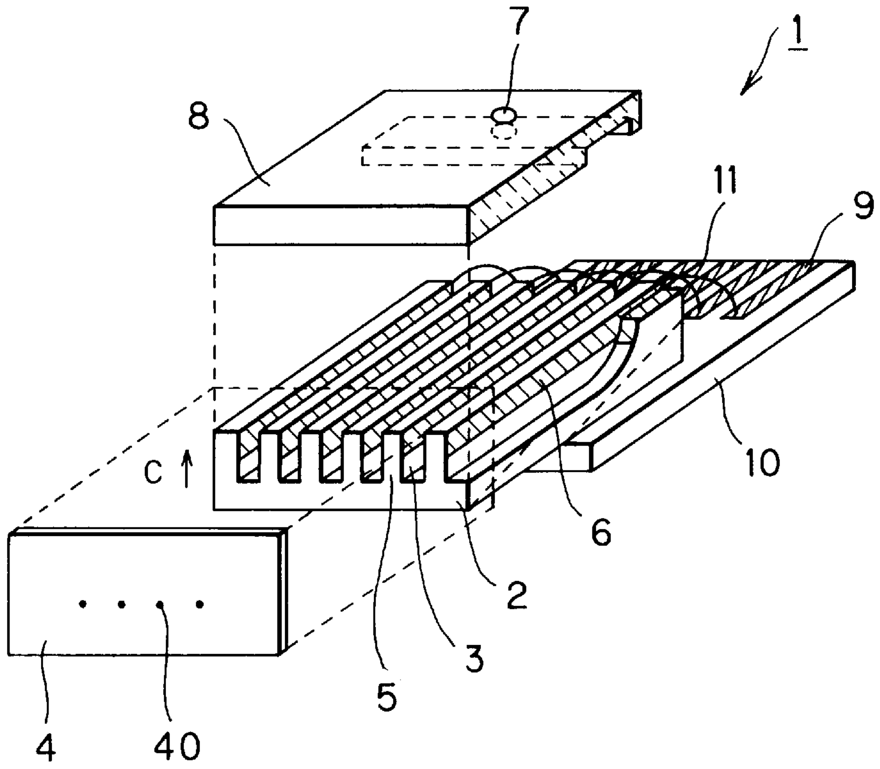
FIG. 2(*a*) is a perspective view showing structure of an ink jet print head 1 which is produced according to a method of an embodiment of the present invention.
Figure 2B:
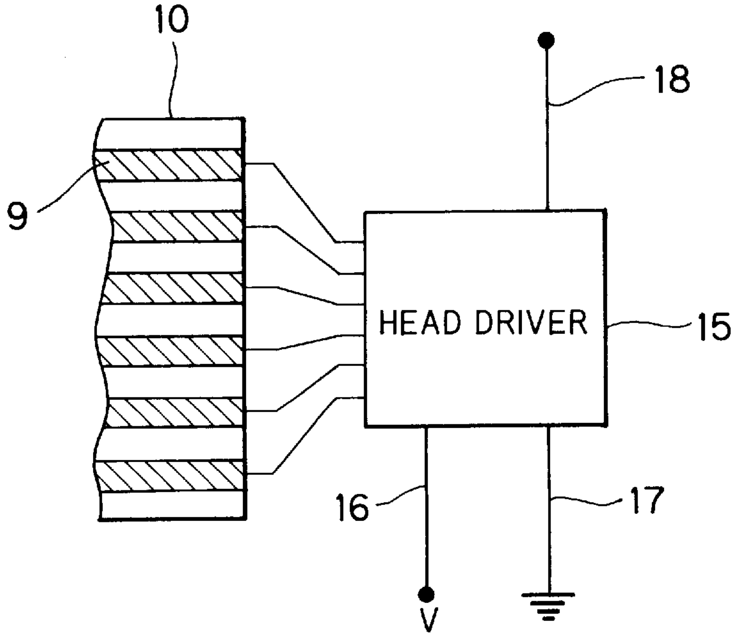

FIG. 2(*a*) is a perspective view showing structure of an ink jet print head 1 of the present embodiment, and FIG. 2(*b*) is a block diagram of a control unit for driving the ink jet print head 1.

An actuator 2 is made of piezoelectric ceramic. In order to produce the actuator 2, a piezoelectric ceramic substrate is first polarized in a direction C shown in the figure. The piezoelectric ceramic substrate is then subjected to a grinding process with a dicing blade. As a result, a plurality of ink channels or grooves 3 are formed parallel with one another. Each ink channel 3 is defined between two adjacent side walls (hereinafter referred to as "piezoelectric side walls") 5. Electrodes 6 are formed on the upper half of opposite surfaces of each piezoelectric side wall 5. The electrodes 6 are formed on the side walls 5 through a plating method. The electrodes 6 are for generating electric fields through the piezoelectric side walls 5 in a direction perpendicular to the polarized direction C.

A cover plate 8, formed with an ink supply opening 7, is bonded with an adhesive 13 to an upper surface of the actuator 2 that is formed with the ink channels 3. The cover plate 8 is made of piezoelectric ceramic. It is noted that the cover plate 8 may be made of other types of ceramic such as alumina. The adhesive 13 is epoxy resin. The plurality of channels 3, covered by the cover plate 8, serve as a plurality of ink chambers 3 each having a rectangular cross-section. All the ink channels 3 are in fluid communication with an ink cartridge (not shown) via the ink supply opening 7. Ink in the ink cartridge will be provided through the ink supply opening 7 to the ink chambers 3.

A nozzle plate 4 is bonded to front end surfaces of the actuator 2 and the cover plate 8. The nozzle plate 4 is made of polyimide resin and has a plurality of nozzles 40. The number of the nozzles 40 is equal to the number of the ink chambers 3. The polyimide resin has characteristics not to deform nor degenerate under a high temperature during a printing process or a production process of the ink jet print head 1.

A substrate 10, provided with a plurality of electrodes 9, is bonded to the under surface of the actuator 2. The number of the electrodes 9 is the same as that of the ink chambers 3. Each electrode 9 is connected via a wire 11 to electrodes 6, which are provided on confronting surfaces of a pair of side walls 5 that sandwich a corresponding ink chamber 3 therebetween. As shown in FIG. 2(*b*), each electrode 9 is connected also to a head driver 15. The head driver 15 is connected to an electric power source V via a connection line 16, to a ground via a connection line 17, and to a CPU (not shown) in the printer via a signal line 18. The CPU controls the head driver 15 to selectively supply voltages to the electrodes 6.

Next, an ink ejection mechanism of the above-described ink jet print head 1 will be described while referring to FIGS. 3(*a*) and 3(*b*).

Figure 3A:
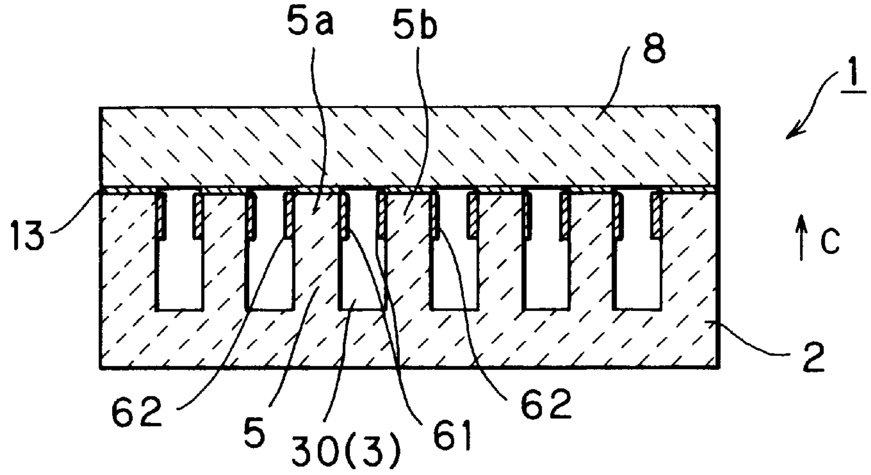
FIG. 3(*a*) is a cross-sectional view showing the ink jet print head 1.
Figure 3B:
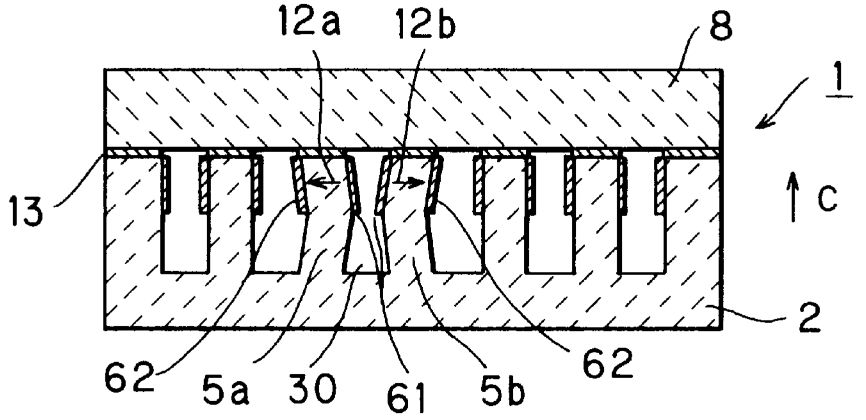

FIG. 3(*a*) is a cross-sectional view showing the ink jet print head 1, and FIG. 3(*b*) illustrates how the actuator 2 is operated when an electric voltage is selectively applied to electrodes 6 (61 and 62) formed on a pair of piezoelectric side walls 5 (5*a* and 5*b*). An ink chamber 3 (30) is provided between the side walls 5*a* and 5*b*. The electrodes 61 are supplied with a positive electric voltage, while the electrodes 62 are electrically grounded. As a result, electric fields are generated in directions 12*a* and 12*b* through the piezoelectric side walls 5*a* and 5*b*, respectively. The upper half portions of the piezoelectric side walls 5*a* and 5*b* are deformed by the piezoelectric thickness shear effect, thereby decreasing the volume of the ink channel 30. Ink in the ink channel 30 is therefore pressurized and ejected through a corresponding nozzle 40. When the application of the voltage is stopped, the piezoelectric side walls 5*a* and 5*b* return to the original shapes. It is noted that the selective application of the electric voltage to the electrodes 6 is controlled by the CPU and the head driver 15 based on print data sent from a host computer (not shown).

The actuator 2, the cover plate 8, and the nozzle plate 4 are assembled together into the ink jet print head 1 as described below.

Figure 4:
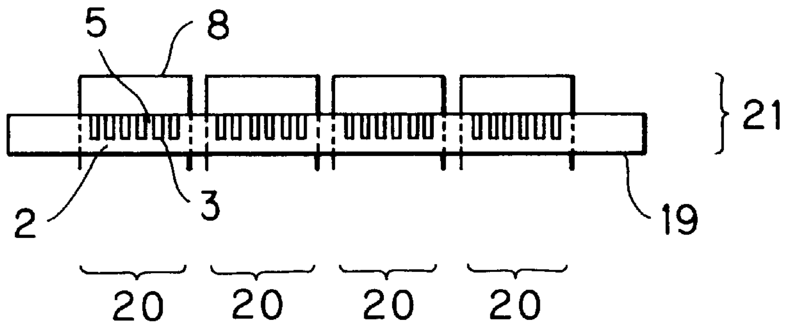
FIG. 4 is a side view showing an actuator body 19 for producing a plurality of actuators 2.

A plurality of the ink jet print heads 1 are produced at the same time for a higher productivity. As shown in FIG. 4, an actuator body 19, made of a piezoelectric ceramic substrate, is prepared and processed to include a plurality of actuators 2. That is, the piezoelectric ceramic substrate is subjected to a grinding process to form a plurality of sets of grooves 3 for a plurality of actuators 2. Each set of the grooves 3 includes a plurality of parallel grooves 3 for a corresponding actuator 2. Each groove 3 is sandwiched between a part of side walls 5. Electrodes 6 are provided on the side walls 5 through a plating process.

Figure 5A:
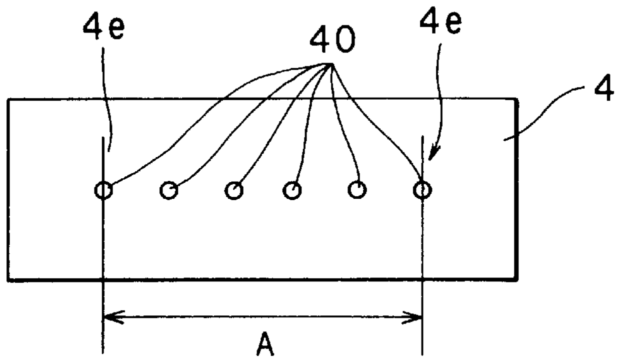
FIG. 5(*a*) shows a nozzle pitch of the nozzles 40 formed on the nozzle plate 4.
Figure 5B:
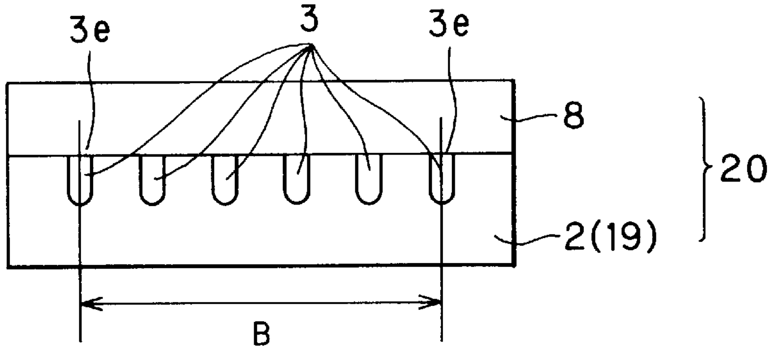

In this example, the plurality of grooves 3 in each actuator 2 are formed at a uniform interval of B/5 as shown in FIG. 5(*b*). That is, six grooves 3 are arranged at the interval B/5 in each actuator 2. Two opposite end grooves 3*e* and 3*e* are apart from each other with a distance B.

Then, a plurality of cover plates 8 and a plurality of nozzle plates 4 are prepared. Each cover plate 8 is formed with an ink opening 7. The cover plate 8 is made of piezoelectric ceramic. The cover plate 8 may be made of another type of ceramic such as alumina. The nozzle plate 4 is made of polyimide resin. Each nozzle plate 4 is formed with a plurality of nozzles 40. The number of the nozzles 40 in each nozzle plate 4 is equal to the number of the grooves 3 in each actuator 2. In this example, six nozzles 40 are formed at a uniform interval of A/5 as shown in FIG. 5(*a*). That is, six nozzles 40 are arranged at the interval A/5. Two opposite end nozzles 4*e* and 4*e* are apart from each other with a distance A.

As will be described later, the nozzle plate 4 is attached to the actuator 2 via epoxy resin 13 through heating processes. The heating processes, however, will cause thermal expansion and will increase the volumes of the nozzle plate 4 and the actuator 2. The nozzle plate, made of polyimide resin, has a thermal expansion coefficient different from that of the actuator 2 which is made of piezoelectric ceramic. Accordingly, the nozzle plate 4 and the actuator 2 will expand at different rates. In view of this, even if the nozzles 40 are located precisely corresponding to the ink channels 3 before the heating processes, they will be shifted from each other through the heating processes.

In more concrete terms, the piezoelectric ceramic has a thermal expansion coefficient of $1.7\times10^{-5}/°$ C. and the polyimide resin has a thermal expansion coefficient of $2.5\times10^{-5}/°$ C. Accordingly, if the nozzle plate 4 and the actuator 2 have originally the same widths of 10 mm, for example, when both of the nozzle plate 4 and the actuator 2 are heated at 150° C., the nozzle plate 4 and the actuator 2 will expand at different rates. A difference between the widths of the expanded nozzle plate 4 and actuator 2 will become about 35 $\mu$m.

According to the present embodiment, therefore, when producing the nozzles 40 and the ink channels 3, the positions of the nozzles 40 and the ink channels 3 are determined so that they will accurately correspond to each other after the heating processes. It is noted that the thermal expansion coefficient of polyimide resin is greater than that of piezoelectric ceramic. Accordingly, when the actuator 2 is formed with the ink channels 3 and the nozzle plate 4 is formed with the nozzles 40, the nozzle pitch is set smaller than the ink channel pitch as shown in FIGS. 5(*a*) and 5(*b*). In more concrete terms, the distance A is set smaller than the distance B. The amount of the difference between the distances A and B is determined based on the difference between the thermal expansion coefficients of the nozzle plate 4 and of the actuator 2. The positions of the nozzles 40 will precisely correspond to the positions of the ink channels 3 after the heating processes. Thus, each nozzle 40 will be properly brought into fluid communication with the corresponding ink channel 3.

In addition to the adjustment of the distances A and B as described above, the sizes of the nozzle plate 4, the actuator 2, and the cover plate 8 are also adjusted considering their thermal expansions during the heating processes. That is, the nozzle plate 4 is originally produced to have an outer size (width) smaller than those of the actuator 2 and the cover plate 8. The difference between the size of the nozzle plate 4 and the sizes of the actuator 2 and the cover plate 8 is determined also based on the difference between the thermal expansion coefficient of the nozzle plate 4 and the thermal expansion coefficients of the actuator 2 and the cover plate 8. After the heating processes, the size of the nozzle plate 4 will match the sizes of the actuator 2 and the cover plate 8. It is noted that the size of the nozzle plate 4 can be adjusted to be equal to those of the actuator 2 and the cover plate 8 through cutting off an excess part of the nozzle plate 4 after the heating processes.

Then, the plurality of cover plates 8 are placed on the upper surface of the actuator body 19 with epoxy resin 13 being provided between the cover plates 8 and the actuator body 19. Each cover plate 8 is located on a corresponding actuator 2 as shown in FIG. 4. In the same manner as shown in FIG. 1, the cover plates 8 and the actuator body 19 are sandwiched between the holding member 41 and the base member 42. The cover plates 8 are pressed against the actuator body 19. Heat is applied to thermally harden the epoxy resin 13, whereby the cover plates 8 are fixedly attached to the actuator body 19. As a result, a drive unit body 21 is produced. The drive unit body 21 is constructed from an integrated structure of the actuator body 19 (i.e., the plurality of actuators 2) and the plurality of cover plate 8. Then, the drive unit body 21 is divided into a plurality of drive units 20 each being constructed from an actuator 2 attached with a cover plate 8.

Figure 6:
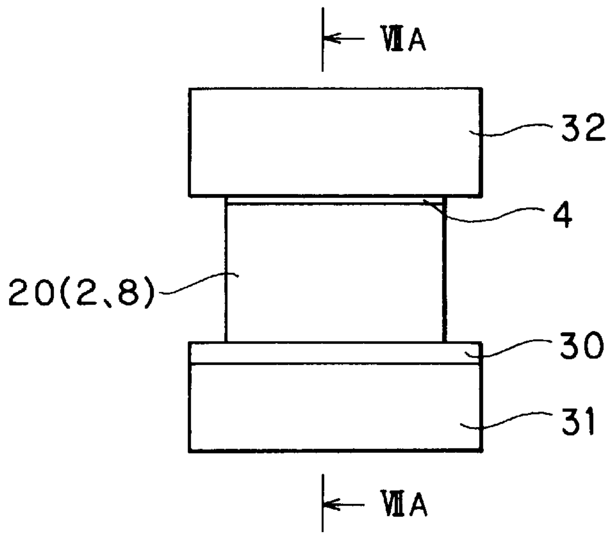
FIG. 6 is a side view showing how the nozzle plate 4 and the drive unit 20 are sandwiched between a heater block 32 and a base plate 31 and heated by the heater block 32.

Next, each drive unit 20 is placed on a silicone rubber sheet 30 which is located on a base plate 31 as shown in FIG. 6. One of the already-prepared plurality of nozzle plates 4 is placed on the drive unit 20. That is, the nozzle plate 4 is attached to a front end surface of a corresponding drive unit 20, i.e., the front end surfaces of the actuator 2 and the cover plate 8. Epoxy resin 13 is provided between the nozzle plate 4 and the drive unit 20.

Figure 7B:
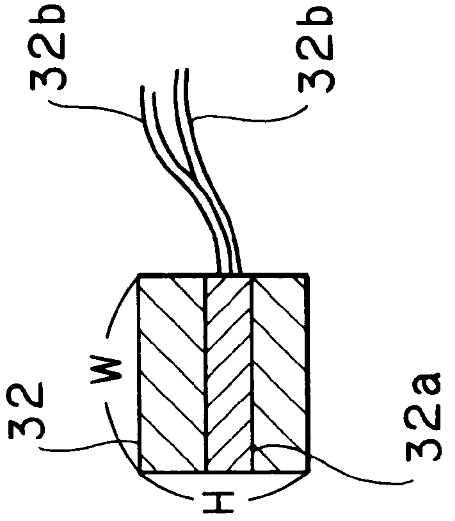
FIG. 7(*a*) is a sectional view of the heater block 32 taken along a line VIIA—VIIA in FIG. 6.
Figure 7A:
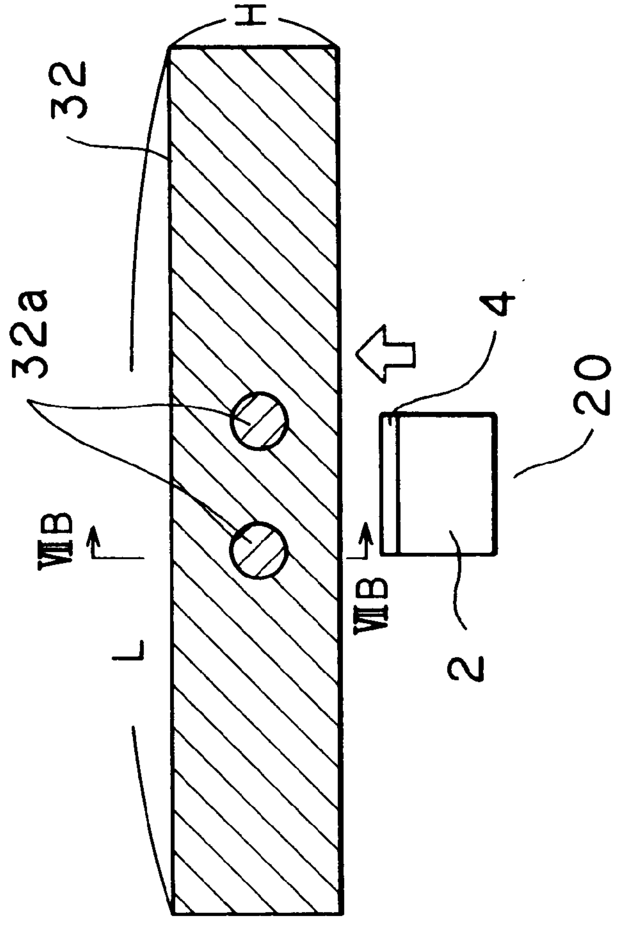

A heater block 32 is then placed on the outer surface of the nozzle plate 4. The heater block 32 is a metal block. As shown in FIGS. 7(*a*) and 7(*b*), the heater block 32 is a rectangular solid block made of stainless steel. For example, the heater block 32 has a length L of about 120 mm, a width W of about 20 mm, and a height H of about 20 mm. The heater block 32 has a weight of about 200 grams. Two cylindrical heaters 32*a* and 32*a* are embedded in the heater block 32. Each heater 32*a* is supplied with power from a power supply (not shown) via a wire 32*b* to heat the heater block 32. The heater block 32 is thus heated by the heaters 32*a* and 32*b*. The heater block 32 is previously heated at a temperature of 160° C. by the internally-provided heaters 32*a*. The heater block 32 is for heating the epoxy resin 13 via the nozzle plate 4. According to this example, each actuator 2 has a length of about 10 mm, a width of about 10 mm, and a height of about 6 mm, and each nozzle plate 4 and each cover plate 8 have corresponding sizes. The heater block 32 therefore has a sufficiently large size relative to the actuator 2, the cover plate 8, and the nozzle plate 4. Accordingly, the heater block 32 can provide, within a short period of time, a sufficiently large amount of heat to the epoxy resin 13 which is provided between the actuator 2, the cover plate 8, and the nozzle plate 4.

The heater block 32 and the base plate 31 sandwich the nozzle plate 4 and the drive unit 20 therebetween as shown in FIG. 6. A pressing device (not shown) is provided to press the heater block 32 downwardly, thereby pressing the nozzle plate 4 against the drive unit 20. At the same time, the heater block 32 applies heat to the epoxy resin 13, thereby thermally hardening the epoxy resin. This block heating-and-pressing process is performed for two minutes. The heater block 32 maintains its temperature at 160° C. during the heating process. Because the heater block 32 is preheated at the desired temperature of 160° C. and because the heater block 32 is directly contacted with the nozzle plate 4, heat is efficiently and rapidly transmitted from the heater block 32 to the epoxy resin 13. The temperature of the epoxy resin 13 increases rapidly. Accordingly, gas is rapidly generated in the epoxy resin and discharged from the epoxy resin. The gas is therefore completely discharged from the epoxy resin by the time the two-minute-heating process is over.

When the two-minute-heating process is over, the heater block 32, the silicon rubber sheet 30, and the base plate 31 are removed. By this time, the epoxy resin is hardened to a certain degree. Then, the nozzle plate 4 and the drive unit 20, which are now bonded to each other to a certain degree, are placed in an oven. The oven is controlled so that the nozzle plate 4, the drive unit 20, and the epoxy resin 13 are applied with heat at 80° C. for 30 minutes. In other words, the nozzle plate 4, the drive unit 20, and the epoxy resin 13 are placed in an atmosphere under a temperature of 80° C. for 30 minutes. As a result, the epoxy resin 13 is completely hardened. Thus, the nozzle plate 4 is fixedly bonded to the drive unit 20. The thus integrated nozzle plate 4 and the drive unit 20 are then connected to the substrate 10, which is connected to the head drive 15 as shown in FIG. 2(*b*). As a result, the ink jet print head 1 is finally produced.

As described above, because heat from the heater block 32 rapidly increases the temperature of the epoxy resin 13, gas generated in the epoxy resin is completely discharged from the epoxy resin by the time the epoxy resin is hardened. Therefore, no spaces due to air bubbles are formed in the epoxy resin 13. The nozzle plate 4 is fixedly attached to the cover plate 8 and the actuator 2 without any spaces formed therebetween.

In the conventional method, the epoxy resin is heated in the oven at 150° C. for 30 minutes. Contrarily, according to the present invention, the epoxy resin is heated by the heater block 32 at 160° C. for only two minutes and then heated in the oven at 80° C. for 30 minutes. It is thus possible to reduce heating cost. Because the two-minute heating by the heating block 32 hardens the epoxy resin 13 to a certain degree, any tools are unnecessary to hold the nozzle plate 4, the cover plate 8, and the actuator 2 during the oven-heating process.

In the above description, the epoxy resin 13 can be hardened to the certain large degree by the heater block 32 and then completely hardened in the oven. However, by using the heater block 32 for a longer period of time, the epoxy resin 13 can be completely hardened with the heater block 32 only. In this case, the attaching process of the nozzle plate 4 to the cover plate 8 and the actuator 2 can be simplified.

During the oven-heating process, the nozzle plate 4, the cover plate 8, and the actuator 2 can be mounted in the jig 50 of FIG. 1, and the jig 50 may be placed in the oven. The nozzle plate 4, the cover plate 8, and the actuator 2 can be heated in the oven altogether with the holding plate 41, the base block 42, and the screw 43. In this case, the nozzle plate 4 can be more properly pressed against the actuator 2 and the cover plate 8. The nozzle plate 4 can be attached more tightly to the cover plate 8 and the actuator 2.

As shown in FIG. 6, the silicone rubber sheet 30 and the base plate 31 are used for holding the actuator 2, the cover plate 8, and the nozzle plate 4 during the block-heating process. However, they are unnecessary as long as enough pressure can be applied by the heater block 32 to the nozzle plate 4, the cover plate 8, and the actuator 2.

As described above, when preparing the nozzle plate 4 and the actuator 2, the distance A between the opposite end nozzles 4*e* and 4*e* on the nozzle plate 4 is set smaller than the distance B between opposite end ink channels 3*e* and 3*e* in the actuator. The difference between the distances A and B is determined dependent on the difference between the thermal expansion coefficients of the actuator 2 (piezoelectric ceramic) and of the nozzle plate 4 (polyimide resin). After being heated, the nozzles 40 will be properly located in correspondence with the ink channels 3. During the heating step, the nozzle plate 4 is placed on the actuator 2 via an adhesive 13 (epoxy resin). Then, the heater block 32 is placed on the nozzle plate 4 so as to heat the adhesive 13 via the nozzle plate 4 and so as to press the nozzle plate 4 against the actuator 2. Accordingly, the temperature of the adhesive 13 rapidly increases, whereby gas is completely discharged out from the adhesive 13 before the adhesive is completely hardened. No air bubbles are trapped in the adhesive, and therefore the nozzle plate 4 can be firmly bonded to the actuator 2.

The nozzle plate 4 (polyimide resin) is thermally expanded to a larger degree than the actuator 2 (piezoelectric ceramic). The amount of the distance A between the opposite end nozzles 4*e* and 4*e* is therefore originally set smaller than the distance B between the opposite and ink channels 3*e* and 3*e*. The amount of this difference is determined based on the difference between the thermal expansion coefficients of the nozzle plate 4 and of the actuator 2. Accordingly, these distances A and B become equal to each other after the expansion of the nozzle plate 4 and the actuator 2 due to the heating processes. Therefore, after the heating processes, the nozzles will precisely correspond to the positions of the ink channels, thereby preventing poor ink ejection and degraded printing quality.

According to the present embodiment, because the heating member 32 is directly attached to the nozzle plate, heat is efficiently transmitted from the heating member 32 to the epoxy resin (adhesive). The temperature of the adhesive increases rapidly. Gas generated in the adhesive is completely discharged from the adhesive by the time the adhesive is hardened, thereby no spaces due to the air bubbles are formed in the adhesive. Therefore, the nozzle plate in fixedly attached to the actuator without any spaces on the surfaces thereof. The adhesive is quickly hardened before being heated in the oven. The actuator and the nozzle plate, which are attached with each other via the adhesive hardened by the heater block, are further heated in an atmosphere under a high temperature to thermally harden the adhesive completely. Therefore, time duration of heating by the heater block can be shortened, and the adhesive can be hardened more tightly. As a result, attaching strength between the actuator and the nozzle plate can be increased. Also, no tools for pressing the nozzle plate against the actuator are required when heating the actuator and the nozzle plate in the oven.

While the nozzle plate and the actuator are heated by the heating block, the heating block and the holding member press the nozzle plate against the actuator. Therefore, the adhesive is hardened to securely attach the nozzle plate to the actuator.

After heated by the heating block, the actuator and the nozzle plate may be heated in atmosphere under a high temperature while being pressed against each other by the holding members. The adhesive is completely hardened to fixedly attach the nozzle plate to the actuator.

The adhesive is heated by the heating block at a higher temperature for a shorter time than the adhesive is heated in the oven thereafter. The adhesive is hardened by the heating block to a certain degree, and then completely hardened in the oven. The oven-heating process can therefore be employed as a supplemental heating process. This improves productivity of the ink jet print head.

Because the nozzle plate is fixedly attached to the actuator, even when the ink jet print head is wiped for maintenance, the nozzle plate stays attaching to the actuator. This provides a high quality ink jet print head with a great durability.

While the invention has been described in detail with reference to the specific embodiment thereof, it would be apparent to those skilled in the art that various changes and modifications may be made therein without departing from the spirit of the invention, the scope of which is defined by the attached claims.

For example, in the present embodiment, the distance A and B are adjusted so that the positions of the nozzles 40 correspond to the positions of the ink channels 3 after the heating processes. However, any other parameters of the nozzle plate 4 and the actuator 2 can be adjusted dependent on the difference between the thermal expansion coefficients of the piezoelectric ceramic and of the polyimide resin.

The method of the present invention can be applied when the cover plate 8 is attached to the actuator 2.

In the above description, the drive unit body 21 (actuator body 19 and the plurality of cover plates 8) is divided into the plurality of drive units 20 before the nozzle plates 4 are bonded to the drive units 20. However, the plurality of nozzle plates 4 may be bonded to the drive unit body 21 through the block-heating process and the oven-heating process. After the nozzle plates 4 are attached to the drive unit body 21, the integrated body may be divided into a plurality of ink jet print heads 1.

In the above description, the heater block 32 is embedded with the cylindrical heaters 32*a*. However, the heater block 32 may be embedded with other various types of heaters. The heater block 32 may be made of various material other than the stainless steel.

What is claimed is:

1. A method of attaching a nozzle plate to an actuator via an adhesive, the method comprising the steps of:

preparing a nozzle plate formed with a plurality of nozzles and an actuator formed with a plurality of channels, positions of the nozzles and positions of the channels being determined dependently on a difference between thermal expansion coefficients of the nozzle plate and of the actuator;

placing the nozzle plate on the actuator with an adhesive being provided therebetween; and heating the adhesive so as to thermally harden the adhesive thereby fixedly securing the nozzle plate to the actuator, the nozzle plate expanding according to its thermal expansion coefficient and the actuator expanding according to its thermal expansion coefficient so that the positions of the nozzles on the expanded nozzle plate correspond to the positions of the channels in the expanded actuator.

2. A method as claimed in claim 1, wherein a predetermined number of nozzles are arranged on the nozzle plate at a uniform interval between its two opposite end nozzles, and the same predetermined number of channels are arranged on the actuator at another uniform interval between its two opposite end channels, a difference between a first distance between the two opposite end nozzles and a second distance between the two opposite end channels being determined dependent on a difference between the thermal expansion coefficients of the nozzle plate and of the actuator.

3. A method as claimed in claim 2, wherein the first distance is set smaller than the second distance, the difference between the first and second distances being determined dependent on the difference between the thermal expansion coefficients of the nozzle plate and of the actuator when the thermal expansion coefficient of the nozzle plate is greater than that of the actuator.

4. A method as claimed in claim 1, wherein the actuator is made of piezoelectric ceramic, and the nozzle plate is made of resin.

5. A method as claimed in claim 1, wherein the actuator preparing step includes the step of:

preparing an actuator body formed with a plurality of ink grooves;

placing a cover plate, formed with an ink introduction opening, onto a surface of the actuator body that is formed with the plurality of ink grooves so that the ink introduction opening will be brought into a fluid communication with the plurality of ink grooves, an adhesive being provided between the cover plate and the actuator body; and thermally hardening the adhesive to fixedly secure the cover plate onto the actuator body, thereby producing the actuator formed with the plurality of ink channels.

6. A method as claimed in claim 5, wherein each of the plurality of ink channels is formed between two adjacent side walls, an electrode being provided over at least a part of each side wall; and further comprising the step of electrically connecting the electrode on each side wall with a control portion, thereby producing an ink jet print head capable of selectively ejecting ink through the nozzles from the corresponding ink channels.

7. A method as claimed in claim 1, wherein the adhesive heating step includes the step of attaching a heating member to the nozzle plate, the heating member applying heat to the nozzle plate while pressing the nozzle plate against the actuator, thereby thermally hardening the adhesive and fixedly connecting the nozzle plate with the actuator thereby.

8. A method as claimed in claim 7, wherein the adhesive heating step further includes the step of placing both the actuator and the nozzle plate connected with the thermally-hardened adhesive in an atmosphere under a high temperature, whereby the adhesive is further heated to be completely hardened to thereby firmly connect the nozzle plate to the actuator.

9. A method as claimed in claim 8, wherein the nozzle plate and the actuator are sandwiched between the heating member attached to the nozzle plate and a holding member attached to the actuator while the adhesive is thermally hardened by the heating member.

10. A method as claimed in claim 9, wherein the actuator and the nozzle plate, with the thermally-hardened adhesive provided therebetween, are sandwiched between a pair of holding members in the atmosphere under the high temperature, the pair of holding members pressing the nozzle plate and the actuator against each other.

11. A method as claimed in claim 8, wherein the temperature of the heating member is set higher than that of the atmosphere during the high temperature atmosphere heating process.

12. A method as claimed in claim 11, wherein the duration of the heat application by the heating member is shorter atmosphere.

13. A method of attaching a nozzle plate to an actuator, the method comprising the steps of:

placing a nozzle plate, formed with a plurality of nozzles, on an actuator formed with a plurality of ink channels, an adhesive being provided between the nozzle plate and the actuator; and attaching a heating member to the nozzle plate, the heating member applying heat to the nozzle plate while pressing the nozzle plate against the actuator, thereby thermally hardening the adhesive to firmly connect the nozzle plate to the actuator.

14. A method as claimed in claim 13, further comprising the step of placing both the actuator and the nozzle plate which are connected with each other via the thermally-hardened adhesive in an atmosphere of a high temperature, thereby further thermally hardening the adhesive and further firmly connecting the nozzle plate to the actuator.

15. A method as claimed in claim 14, wherein the nozzle plate and the actuator are pressed against each other while being heated by the heating member attached to the nozzle plate and a holding member attached to the actuator.

16. A method as claimed in claim 15, wherein both the actuator and the nozzle plate, connected with the thermally-hardened adhesive, are placed in the atmosphere of the high temperature while being pressed against each other by a pair of holding members each being attached to one of the nozzle plate and the actuator, thereby thermally hardening the adhesive and fixedly securing the nozzle plate to the actuator.

17. A method as claimed in claim 16, wherein the temperature of the heating remember is higher than that of the high temperature atmosphere, and duration of the heat application by the heating member is shorter than that of the heat application by the high temperature atmosphere.

18. A method of as claimed in claim 17, further comprising the step of connecting a control portion to the actuator, the control portion being designed to control the actuator to selectively eject ink from the ink chambers through the corresponding nozzles.

* * * * *